United States Patent [19]
Gärtner et al.

[11] Patent Number: 4,883,362
[45] Date of Patent: Nov. 28, 1989

[54] DEVICE FOR ENRICHING A CARRIER GAS WITH THE VAPOR OF A SPARINGLY VOLATILE SUBSTANCE

[75] Inventors: Georg F. Gärtner; Hans Rau, both of Aachen; Peter A. Janiel, Würselen, all of Fed. Rep. of Germany

[73] Assignee: U.S. Philips Corp., New York, N.Y.

[21] Appl. No.: 148,800

[22] Filed: Jan. 27, 1988

[30] Foreign Application Priority Data

Jan. 31, 1987 [DE] Fed. Rep. of Germany ....... 3702923

[51] Int. Cl.$^4$ .............................................. B01F 13/02
[52] U.S. Cl. ................................... 366/101; 366/144; 366/341; 406/87; 406/92; 222/630
[58] Field of Search ............... 366/144, 101, 106, 149, 366/341; 222/630; 406/87, 92

[56] References Cited

U.S. PATENT DOCUMENTS

| | | | |
|---|---|---|---|
| 2,878,972 | 3/1959 | Matthews | 222/630 |
| 3,312,507 | 4/1967 | Oehlrich et al. | 406/92 |
| 3,618,828 | 11/1971 | Schinella | 222/630 X |
| 4,345,841 | 8/1982 | Day | 366/341 X |

FOREIGN PATENT DOCUMENTS

| | | | |
|---|---|---|---|
| 3339625 | 5/1985 | Fed. Rep. of Germany. | |
| 869800 | 10/1981 | U.S.S.R. | 366/101 |
| 956992 | 9/1982 | U.S.S.R. | 222/630 |

Primary Examiner—Stephen Marcus
Assistant Examiner—Christine A. Peterson
Attorney, Agent, or Firm—William L. Botjer

[57] ABSTRACT

An enriching device consisting of a container which comprises a removable tightly fitting metal body the sparingly volatile material being present in a coiled groove. During operation of this device transverse flows and shortcuts, respectively, of the carrier gas flow occur. To assure that the carrier gas flows through the material without having an escape possibility, the groove (5) is made either in an outer wall of the metal body (8) or in the bottom (4) of the container (1), and the parts (6) present between the individual turns of the groove have a cutting edge, i.e. a cross-sectional profile in the form of a wedge, the tip of which is in contact either with the smooth inner wall of the container (1) or with the smooth lower side of the metal body (8). The device is suitable for adjusting a defined mass flow of sparingly volatile materials which are used as starting compounds for chemical deposition from the gaseous phase.

18 Claims, 2 Drawing Sheets

DEVICE FOR ENRICHING A CARRIER GAS WITH THE VAPOR OF A SPARINGLY VOLATILE SUBSTANCE

BACKGROUND OF THE INVENTION

1. Field of the Invention

The invention relates to a device for enriching a carrier gas or a mixture of carrier gases with the vapour or the vapours of a sparingly volatile substance or a mixture of substances which is present in the form of small solid particles, consisting of a container which comprises a removable, tightly fitting metal body in which in at least one outer wall of the metal body a coiled groove is provided and said outer wall is in contact with the inner wall of the container in such a manner that the groove forms a heatable inner space for receiving the material or the mixture of material, which body is provided with an inlet duct for the carrier gas and an outlet duct for the enriched carrier gas, the ducts opening into the inner space in such a manner that the carrier gas during operation of the device flows through the material or the mixture of materials.

2. Description of the Related Art

Such a device in which the groove is coiled, for example, in the form of a spiral or in a zig-zag or meander-like manner, is known from Pat. No. DE OS 3 339 625. This device, sometimes termed saturator, serves for the adjustment of a defined gas flow or mass flow of sparingly volatile materials which are used, for example, as starting compounds for a chemical deposition from the gaseous phase (CVD method). As examples for such materials are mentioned compounds of IIIB metals in particular or rare earth metals and thorium, in particular metalorganic compounds, for example, thorium acetyl acetonate and thorium trifluoroacetyl acetonate. The saturator which comprises the sparingly volatile material or the mixture of sparingly volatile materials in powder form shows a long flow path and after use can easily be cleaned and be used again. The loaded carrier gas flow emanates from the saturator in the mixing chamber and then enters into a reactor in which the chemical deposition from the gaseous phase takes place.

The disadvantage of the known saturator is that the individual turns of the groove are not closely separated from each other when at the supporting points at which the outer wall of the metal body and the inner wall of the container are in contact with each other layers of powder residues are present so that transverse flow and shortcuts of the carrier gas flow, respectively, may occur which reduce the efficiency of the saturator. A further transverse leak for the carrier gas may occur by the fitting of the metal body, for example a copper block, in the container when the metal body is not densely packed.

Moreover, the known saturator already shows a strong decrease of its efficiency and of the mass flow of sparingly volatile material when the quantity of material present for evaporation and for transport to the CVD reactor is still available. This is due to the fact that the layer of powder in the grooves is slowly exhausted when the consumption increases, collapses, and the carrier gas flows over the surface of the layer without a sufficient saturation being achieved in particular when the provided material has a very low coefficient of evaporation. Moreover in some metalorganic compounds phase transitions occur when the temperature increases which are associated with changes of the density.

SUMMARY OF THE INVENTION

It is an object of the invention to provide a saturator in the operation of which the carrier gas flows through the material or the mixture of materials without having an escape possibility and with which a sufficiently large and constant mass flow for the chemical deposition from the gaseous phase in particular at low pressure in the saturator (for example 1 to 100 hPa) of the said material over longer deposition times is achieved.

According to the invention this object is achieved in that in a device of the type mentioned in the opening paragraph the parts of the outer wall of the metal body which are present between the individual turns of the groove and which are in contact with the inner wall of the container and which separate the individual turns from the groove from each other have a cross-sectional profile in the form of a wedge the tip of which is in contact with the inner wall of the container.

From the wedge-shaped cross-sectional profile it appears that the parts present between the individual turns of the groove have the form of a cutting edge.

An alternative embodiment of the device consists in that the groove is provided in the bottom of the container while the lower side of the metal body is smooth, the parts of the bottom of the container which separate the individual turns of the groove from each other having a cross-sectional profile in the form of a wedge the tip of which is in contact with the lower side of the metal body. The advantage of this embodiment is that the groove can more easily be filled.

So the groove is provided either in an outer wall of the metal body, for example in its lower side, or in the bottom of the container. The parts present between the individual turns have a cross-sectional profile in the form of a wedge, the tip of which is in contact either with the smooth inner wall of the container or with the smooth lower side of the metal body.

In both embodiments it is advantageous for the material of the part which shows the wedge-like cross-section to be harder than the material of the part with which the top of the part having the wedge-like cross-section is in contact. For example, in the first embodiment the metal body consists of a noble steel and the inner wall of the container is of copper, while in the second embodiment the bottom of the container is of noble steel and the metal body consists of copper. As a result of this it is achieved that the top of the part having the wedge-like cross-section when assembling the device slightly penetrates or cuts into the softer part, which leads to an excellent gas seal.

However, it is not necessary for the top and the remaining surface of the groove to consist of the same material, for example, it is advantageous to cover the top of the part having the wedge-like cross-section with a hard material, for example, titanium nitride or titanium carbide, for example by CVD.

In the cross-sectional profile of the groove sides the edges of the wedge enclose and angle between 40° and 140°, preferably between 60° and 90°. The two edges of the wedge may also be inclined differently. At any rate a dense separation is achieved between the individual turns of the groove.

The cutting edge mentioned hereinbefore may be a sharp cutting edge, that is to say the edge between the surfaces limiting the groove in this case is in cross-section a curved line having a microscopically small radius of curvature. It has been found, however, that a rounded profile has the same favourable effect in most cases, for example with coarse granular powders and has the additional advantage that it can even more easily be cleaned without sharp edges being noticeable.

It further appears from the wedge-like cross-sectional profile that the groove in its simplest form shows a V-shaped cross-section. In order to achieve a high efficiency of the saturator and a dense cross-separation between the individual turns of the groove, however, other cross-sectional profiles of the groove are at least equally advantageous. For the purpose of a better cleaning of the groove it is even advantageous to make the profile in the depth of the groove flat or round recessed. Such grooves show a groove-like vaulted or a trough-shaped cross-section. For the shape of the cross-sectional profile it is essential only that it is regular and the shape at the area between the side and centre of the groove mathematically is a monotonously falling curve or polygon.

The radius of curvature $r_K$ of the rounded tip of the wedge mentioned hereinbefore in all cases is substantially smaller than the radius of curvature $r_B$ of the groove-shaped vault; it holds, for example, that $r_K < \frac{1}{3} r_B$ with which a still operating seal is obtained. In this case also it is of advantage to choose the material of the supporting rounding to be harder than the material of the compressed metal body.

The container is filled with powdered sparingly volatile material which, for mechanical stabilisation and the finest possible distribution, is preferably mixed with a coarse granular inert material, for example, quartz powder in the ratio 1:2. In the second embodiment the groove is filled to the brim with a mixture of powder, for example of a metal-organic compound and quarts powder.

A fitting metal body, for example, a copper block, is then pressed on the bottom of the container, for example, by means of a bayonet catch. An additional outer seal of the inner space is optionally achieved by a seal provided between the metal body and the container, for example, a seal of a fluoro-elastomer or gold.

For heating, the container is provided on a liquid bath containing a thermostat, for example an oil bath. The heating of the device may also be done electrically. Moreover, heatable open/closed valves may be provided at the gas inlet and the gas outlet. It is advantageous that in the gas inlet to the valve and the gas outlet before the valve powder retaining filters are provided which cause only a very small fall in pressure.

As already stated the mass of the provided sparingly volatile material decreases continuously with continuous carrier gas flow, so that the filling height in the inner space formed by the groove decreases in the course of time and the carrier gas, due to the lower flow resistance, flows particularly through the intermediate space formed over the surface of the remaining sparingly volatile material and the saturation pressure decreases. The saturation pressure decreases more strongly according as the coefficient of evaporation of the sparingly volatile material is lower. A constant mass flow of the starting compound for the CVD method can then no longer be maintained.

This disadvantage is preferably eliminated in that the filled container is provided in the liquid bath in such a manner that the bottom of the container is parallel to the direction of gravity and the carrier gas during operation of the device flows through the material or the mixture of materials from the top.

The saturator, after filling and closing, is tilted over 90° in such a manner that the bottom of the container and the lower side of the metal body are parallel to the direction of gravity, the carrier gas inlet occurring from the top. By this tilting it is achieved that the cavities formed in the turns of the groove are now formed in the part of the saturator which is highest because the remaining powder is colledted due to gravity in the part of the saturator which is now lower. As a result of this the carrier gas is forced to flow through the remaining powder in a highly divided form without having the possibility of forming escapes. In this vertical mode of operation the activity of the saturator does substantially not deteriorate so long as more than $\frac{1}{4}$ of the starting quantity is present.

Should it be necessary to maintain the horizontal position of the saturator after filling, because for structural reasons there is no possibility of tilting, the cavity and escape formation according to a further embodiment of the invention is prevented by a pressure chamber which is separated from the inner space formed by the groove by a flexible diaphragm.

The pressure chamber is preferably formed so that a second coiled groove is situated oppositely to the coiled groove and is formed in the lower side of the metal body or in the bottom of the container (so there where up till now no groove was present) and which is separated from the first groove by the diaphragm, the space enclosed by the second groove and the diaphragm, i.e. the pressure chamber, being connected to a pressure gas duct.

In a further embodiment of the invention several parallel extending grooves are provided in the outer wall of the metal body or in the bottom of the container instead of one single groove. By providing, for example, 10 parallel grooves instead of one single groove, the flow cross-section is increased by a factor 10, the flow rate becomes slower, the saturation efficiency is improved (and remains optimal, respectively), the supplied quantity of the CVD reactor is increased and the duration of use is extended.

The saturator according to the invention has the advantage that gas inlet and outlet are sealed from each other, that the filling quantity of material is exactly determined and that when filling to the brim of the upper sides of the parts between the individual turns of the groove it is not possible that too large or too small quantities are supplied. Moreover, sparingly volatile material having very low coefficients of evaporation are also enriched in the carrier gas on the long, coiled flow path which, for example, is 70 to 100 cm in length. Moreover, by cutting the said edges in the metal body a transverse flow of the carrier gas is avoided which otherwise would reduce the efficiency of the saturator.

BRIEF DESCRIPTION OF THE DRAWINGS

The invention will now be described in greater detail with reference to a few embodiments which are shown in the drawings, in which FIGS. 1a to 2d are cross-sectional profiles of grooves.

DESCRIPTION OF THE PREFERRED EMBODIMENTS

Figure 1:
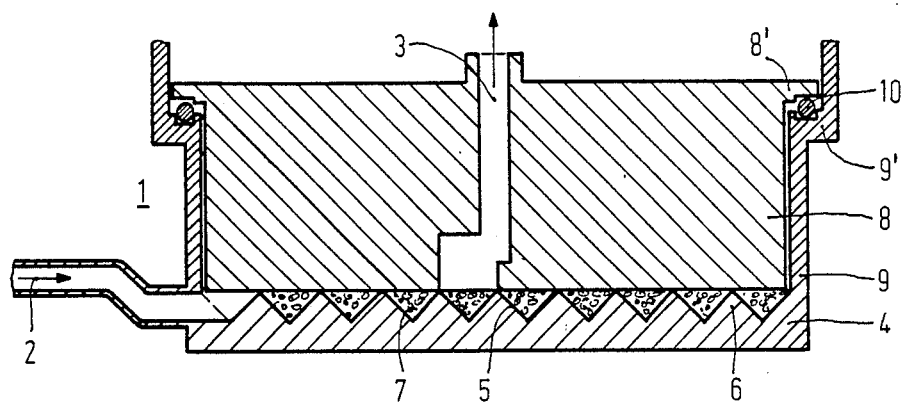
FIG. 1 is a diagrammatic cross-sectional view of a saturator.

The saturator shown in FIG. 1 comprises a container 1, for example, of noble steel, having a carrier gas inlet 2 and a carrier gas outlet 3 each having a gas inlet and gas outlet valve and a flow quantity control of the carrier gas (not shown). Furthermore provided in the gas inlet 2 and in the gas outlet 3 are a thin fine sieve and/or a piece of aluminum oxide wool (not shown) which serves for retaining the filled powder (see further hereinafter). The bottom 4 of the container is provided with a coiled groove 15 having a V-shaped cross-section. The individual turns of the groove 5 are separated from each other by parts 6 having a wedge-like cross-section. A sparingly volatile material 7 in the form of powder is present in the coiled groove 5. The material may optionally be mixed with quartz powder. A metal body 8, for example, an insert of copper, is pressed on the tips and sides, respectively, of the parts 6, for example, by a bayonet catch (not shown) or by screwing in a screw-thread cut in the wall 9 of the container. The seal of the inner space occurs by a sealing ring 10 provided between a supporting point 8' of the metal body 8 and a supporting point 9' of the wall 9 of the container, for example, of fluoro-elastomer or of gold. The heating of the saturator is done by dipping in an oil bath having a thermostat (not shown).

Figure 2A:
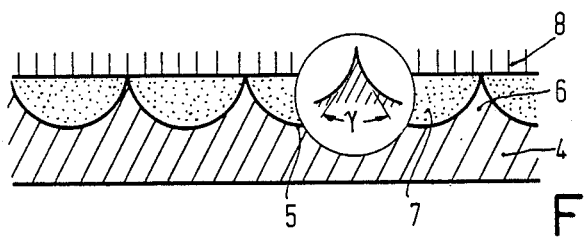
Figure 2B:
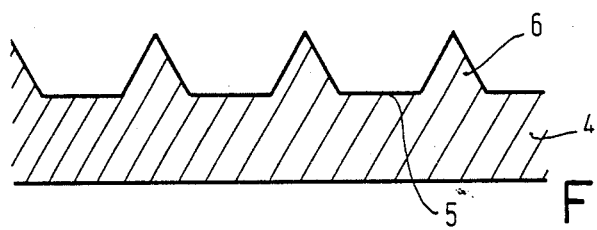
Figure 2C:
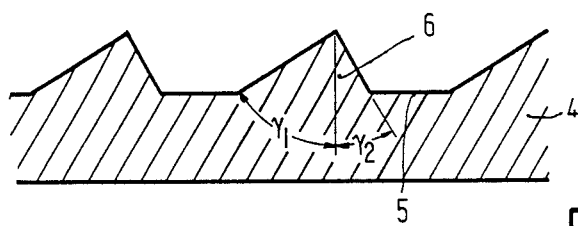
Figure 2D:
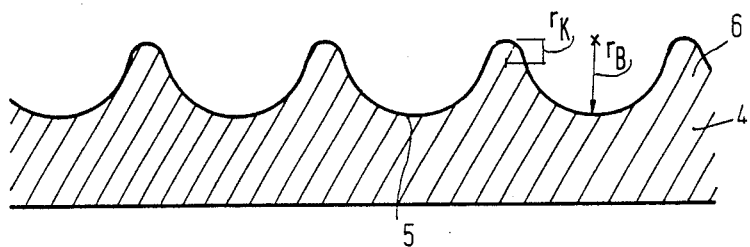

FIGS. 2a to 2d show different groove profiles formed in the bottom 4 of the container. FIG. 2a shows a groove-like profile, FIGS. 2b and 2c show trough-like profiles. In the enlarged cross-sectional views of FIGS. 2a and 2c angles $\gamma$, $\gamma_1$ and $\gamma_2$ are shown which enclose the edges of the wedge 6. FIG. 2c shows in what manner the two edges of the wedge are differently curved ($\gamma_1 > \gamma_2$) as a result of which a better seal with the pressed metal body in temperature cycles with large variations is achieved. As shown in FIG. 2d the tip of the wedge 6 is rounded; in an enlarged cross-sectional view the radius of curvature $r_K$ of the rounded tip and the radius of curvature $r_B$ of the groove-shaped vault are shown.

Figure 3:
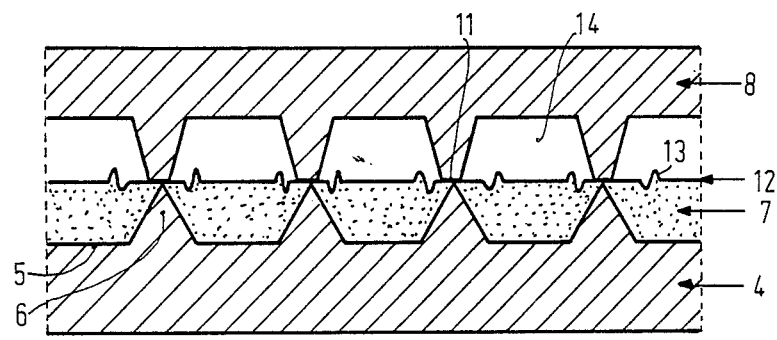
FIG. 3 is a cross-sectional view of a part of a saturator with pressure chamber.

Reference numeral 4 in FIG. 3 again denotes the bottom of the container having the groove 5 and the parts 6 of wedge-like cross-section. 7 is the saturator filling, 8 denotes the metal body and 11 is the opposite supporting surfaces for the tops of the parts 6 having the wedge-like cross-section. A flexible diaphragm 12, for example, of tantalum sheet, is provided between the bottom 4 of the container and the metal body 8 and the top of the parts 6 and the opposite supporting surfaces 11, respectively, in which additionally expansion grooves are provided so as to achieve a favourable deformation. After filling and closing the saturator the diaphragm is smoothly pressed on the filling 7. With increasing transport of the sparingly volatile material the filling, i.e. the powder layer, slightly collapses. By providing a pressure chamber 14, which extends fittingly to the bottom of the container, i.e. also in the form of a spiral, with a gas of a pressure (preferably an inert gas which may be identical to the carrier gas) which is higher than the pressure in the filling 7, the diaphragm may again be pressed tightly to the surface of the filling, so that a gap is not formed between the groove termination and filling surface. In many cases it suffices to leave the pressure chamber under normal atmospheric pressure so that the diaphragm at the usually very low pressure within the groove (<100 hPa) is automatically pressed on the filling.

Figure 4:
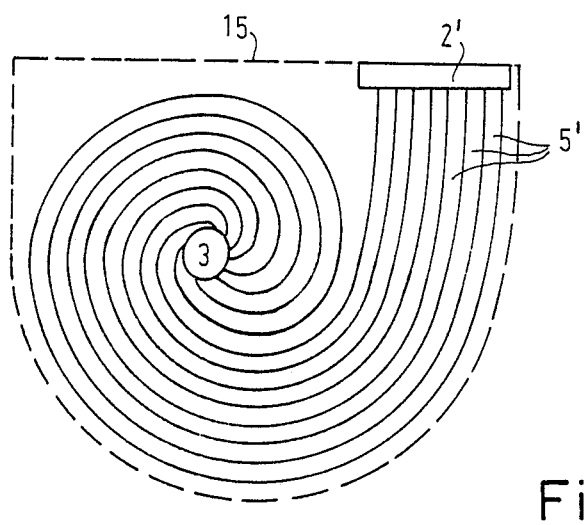
FIG. 4 is a plan view of a part of a saturator having several parallel grooves.

2' in FIG. 4 denotes a gas inlet chamber connected to the carrier gas inlet (not shown), 5a denotes several parallel extending grooves and 3 is a carrier gas outlet. The edges 15 of the component comprising the grooves may be semicircular but also rectangular or circular. In the latter case the inlet chamber 2' is provided on the circular edge side. The spiral centre, i.e. the carrier gas outlet and the centre of the circle are not identical. In this device also a tilting by 90° may occur.

What is claimed is:

1. A device for enriching a carrier gas with the vapor of a volatile material composed of relatively small solid particles comprising:
    a container having an outer wall and at least one side wall;
    a tightly fitting metal body insertable within said container, said metal body having a surface for engagement with the outer wall of said container;
    at least one of said outer wall of said container and said engagement surface of said metal body having at least one spiral groove forming a heatable inner space for holding the volatile material through which the carrier gas passes and flows, said grooves having a wedge-like cross section with the tips of the wedges disposed in contact with the other of said outer wall of said container and said engagement surface of said metal body to separate the individual turns of the groove from each other;
    an inlet duct leading to one end of said spiral groove for entry of the carrier gas; and
    an outlet duct disposed at the other end of said spiral groove for outletting said enriched carrier gas.

2. A device as claimed in claim 1, characterized in that the material of the parts which have the wedge-like cross-section is harder than the material of the part with which the top of the parts having the wedge-like cross-section are in contact.

3. A device as claimed in claim 1, characterized in that the top of each part having the wedge-like cross-section is covered with a hard material.

4. A device as claimed in claim 1, characterized in that the edges of the wedge enclose an angle between 40° and 140°.

5. A device as claimed in claim 4, characterized in that the edges of the wedge enclose an angle between 60° and 90°.

6. A device as claimed in claim 4, characterized in that the two edges of the wedge are differently inclined.

7. A device as claimed in claim 4, characterized in that the tip of the wedge is rounded.

8. The device as claimed in claim 1, characterized in that the groove has a V-shaped cross-section.

9. A device as claimed in claim 2, characterized in that the groove has a groove-shaped vaulted cross-section.

10. A device as claimed in claim 1, characterized in that the groove has a trough-shaped cross-section.

11. A device as claimed in claim 1, characterized in that the volatile material is mixed with a coarse granular material.

12. A device as claimed in claim 1, characterized in that the container is provided in a liquid bath having a thermostat.

13. A device as claimed in claim 1, characterized in that heatable open-close valves are provided on a gas inlet and a gas outlet.

14. A device as claimed in claim 13, characterized in that in the gas inlet after the valve and in the gas outlet before the valve a powder-retaining filter is provided.

15. A device as claimed in claim 12, characterized in that the filled container is provided in a liquid bath in such a manner that the bottom of the container is parallel to the direction of gravity and the carrier gas during operation of the device flows through the material or the mixture of materials from the top.

16. A device as claimed in claim 1, characterized by a pressure chamber which is separated by a flexible diaphragm from the inner space formed by the groove.

17. A device as claimed in claim 16, characterized in that a second coiled groove is positioned oppositely to the coiled groove and is made in the bottom of the container or in the lower side of the metal body (8) and which is separated from the first groove (5) by a diaphragm (12), the space enclosed by the second groove (14) and the diaphragm (12) communicating with a pressure gas duct.

18. A device as claimed in claim 1, characterized in that several parallel extending grooves are disposed in at least one of the outer wall of the metal body and in the bottom of the container.

* * * * *